US010505541B2

(12) United States Patent
Kumar et al.

(10) Patent No.: US 10,505,541 B2
(45) Date of Patent: Dec. 10, 2019

(54) HIGH-VOLTAGE TOLERANT LEVEL SHIFTER USING THIN-OXIDE TRANSISTORS AND A MIDDLE-OF-THE-LINE (MOL) CAPACITOR

(71) Applicant: QUALCOMM Incorporated, San Diego, CA (US)

(72) Inventors: Albert Kumar, San Jose, CA (US); Ramaprasath Vilangudipitchai, San Diego, CA (US); Vasisht Vadi, San Diego, CA (US); Paul Penzes, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 153 days.

(21) Appl. No.: 15/680,643

(22) Filed: Aug. 18, 2017

(65) Prior Publication Data

US 2019/0058477 A1 Feb. 21, 2019

(51) Int. Cl.
*H03K 19/0185* (2006.01)
*H01L 27/06* (2006.01)

(52) U.S. Cl.
CPC . *H03K 19/018507* (2013.01); *H01L 27/0629* (2013.01)

(58) Field of Classification Search
CPC ............ H03K 17/10; H03K 19/00315; H03K 19/018507; H01L 27/0629
See application file for complete search history.

(56) References Cited

U.S. PATENT DOCUMENTS

| 6,522,323 | B1 * | 2/2003 | Sasaki | H03K 19/01858 |
| | | | | 326/62 |
| 7,385,441 | B2 | 6/2008 | Liu | |
| 7,772,884 | B2 | 8/2010 | Kwon et al. | |
| 8,049,532 | B1 | 11/2011 | Maangat et al. | |
| 8,514,119 | B2 | 8/2013 | Santos et al. | |
| 8,649,477 | B2 | 2/2014 | Matsui | |
| 9,633,996 | B1 * | 4/2017 | Ge | H01L 27/0629 |
| 9,893,144 | B1 * | 2/2018 | Yang | H01L 28/60 |
| 10,243,562 | B2 * | 3/2019 | Haensch | H01L 27/1255 |
| 2002/0190770 | A1 | 12/2002 | Yin et al. | |

(Continued)

FOREIGN PATENT DOCUMENTS

WO    2016183687 A1    11/2016

OTHER PUBLICATIONS

International Search Report and Written Opinion—PCT/US2018/042860—ISA/EPO—dated Sep. 28, 2018.

*Primary Examiner* — Patrick O Neill
(74) *Attorney, Agent, or Firm* — Haynes and Boone, LLP

(57) ABSTRACT

A level shifter according to some embodiments is disclosed. In some embodiments, a level shifter includes a middle-of-the-line (MOL) capacitor; and a circuit including at least one thin-film transistor coupled to the MOL capacitor, wherein an input voltage provided to the MOL capacitor is split between the MOL capacitor and the circuit. The MOL capacitor can be formed with a contact strip adjacent to a gate structure. A method of forming a level shifter using thin-oxide technologies includes forming a middle-of-the-line (MOL) capacitor; forming a circuit with one or more thin-film transistors; and coupling the MOL capacitor to the circuit such that an input voltage provided at the MOL capacitor is split between the MOL capacitor and the circuit.

24 Claims, 6 Drawing Sheets

(56) References Cited

U.S. PATENT DOCUMENTS

2008/0204097 A1    8/2008   Wu et al.
2011/0031944 A1*   2/2011   Stirk .................... H02J 7/0021
                                                                                  323/234

\* cited by examiner

HIGH-VOLTAGE TOLERANT LEVEL SHIFTER USING THIN-OXIDE TRANSISTORS AND A MIDDLE-OF-THE-LINE (MOL) CAPACITOR

BACKGROUND

The present disclosure relates generally to a level shifter and, in particular, to a level shifter formed with thin-oxide transistors and middle-of-the-line (MOL) capacitors.

Level shifters are used to bring the voltage from a high voltage level (for example 1.8V or more) at a pad of an integrated circuit down to the voltage at the core of the integrated circuit, for example around 0.75V. The high voltage presented at the pad of the integrated circuit may damage the core transistors. In conventional system, the transistors used in the level shifters are formed of thick-oxide transistors and thick-oxide capacitors because the thin-filmed transistors used in the core, which typically break down at a high voltage of 1.2-1.8V, will be damaged by the high voltage presented at the pad.

However, forming the level shifters with more robust thick-oxide transistors has several difficulties, especially when used with newer thin-oxide finFET technologies. Among these difficulties, thick-oxide structures are large and bulky and therefore the use of such structures inherit a severe area penalty for producing thick oxide structures close to thin oxide structures. Additionally, the need for at least three extra masks (oxide and source/drain implants) to form the thick oxides results in additional costs of manufacture.

Accordingly, it would be desirable to provide better level shifters that accommodate the shift from a high input voltage to a lower voltage appropriate for use with thin-oxide structures.

SUMMARY

A level shifter according to some embodiments is provided. In some embodiments, a level shifter includes a middle-of-the-line (MOL) capacitor; and a circuit including at least one thin-film transistor coupled to the MOL capacitor, wherein an input voltage provided to the MOL capacitor is split between the MOL capacitor and the circuit. The MOL capacitor can be formed with a contact strip adjacent to a gate structure.

A method of forming a level shifter using thin-oxide technologies includes forming a middle-of-the-line (MOL) capacitor; forming a circuit with one or more thin-film transistors; and coupling the MOL capacitor to the circuit such that an input voltage provided at the MOL capacitor is split between the MOL capacitor and the circuit.

These and other embodiments are further discussed below with reference to the following figures.

DETAILED DESCRIPTION

In the following description, specific details are set forth describing some embodiments consistent with the present disclosure. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure. In addition, to avoid unnecessary repetition, one or more features shown and described in association with one embodiment may be incorporated into other embodiments unless specifically described otherwise or if the one or more features would make an embodiment non-functional.

For clarification, some specific numeric examples of certain aspects of embodiments are provided below. One skilled in the art will recognize that these examples can be modified to provide further examples. The examples provided, and particularly the numerical values, are not intended to be limiting of the invention and are only provided to clarify the disclosure.

Embodiments of the present invention provide for voltage level shifter that can be implemented on an integrated circuit to receive high voltages, for example from an input pad, and provide voltages to a core of thin-film transistors of the integrated circuit. The voltage provided to the core is low enough to not damage the thin-film transistors in the core. Embodiments of a voltage level shifter can provide a middle-of-the-line (MOL) capacitor in front of thin-oxide transistor to effectively thicken the oxide in the structure. Such a structure avoids the use of thick-oxide capacitors and transistors.

MOL capacitors can be formed in advanced processing technology and used to create high capacitor density structures. Such structures can be compatible with standard cell libraries for formation of finFET structures. The high voltage input can be safely split between the MOL capacitor and the thin-film transistor in order to provide a safe voltage for the thin-film transistors in the core of an integrated circuit.

In order to avoid problems with a floating node between the MOL capacitor and the thin-film transistor, in some embodiments, a latching circuit may be formed between the MOL capacitor and the thin-film transistors. The latching circuit sets the voltage at the floating nodes to be either Vdd or Vss. In some embodiments, an initialization circuit may be coupled to the latching circuit in order to set initial conditions. These embodiments are further discussed below in more detail.

Figure 1:
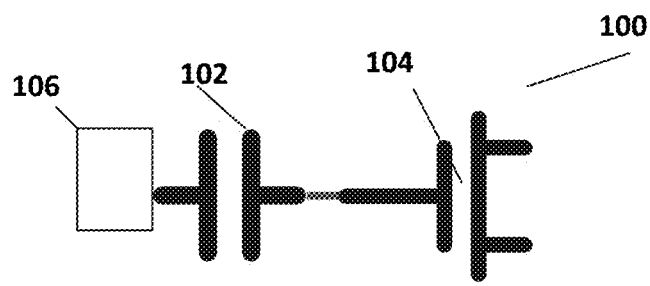
FIG. 1 illustrates an embodiment of a level shifter circuit according to aspects of the present invention.

FIG. 1 illustrates conceptually an embodiment of a shifter 100 of the present invention. As is illustrated in FIG. 1, a MOL capacitor 102 is placed in series with a thin-film transistor 104. As is further illustrated, the combination of capacitor 102 and thin-film transistor 104 can be coupled to receive a high input voltage from an input pad 106 of an integrated circuit. Level shifter 100 shifts the high voltage received on pad 106 to an internal voltage Vdd that is low enough not to damage the thin-film transistors forming the circuitry of the integrated circuit. Although level shifter circuit 100 is illustrated in FIG. 1 as being coupled to an input pad 106, level shifter circuit 100 may be further used internally to the integrated circuit anywhere that a high voltage is shifted to internal voltages low enough not to damage core transistors.

Adding MOL capacitor 102 in front of thin-oxide transistor 104 effectively thickens the oxide such that the combination structure can tolerate the high voltage input at pad 106. The level shifter 100 arrangement illustrated in FIG. 1 increases the allowed input voltage because the MOL capacitor 102 and thin-film transistor 104 form a capacitive divider. For example, if the capacitance of MOL capacitor 102 is the same as that of the gate capacitance of transistor 104, then the input voltage is split between MOL capacitor 102 and transistor 104. Consequently, the voltage at the intermediate node between MOL capacitor 102 and transistor 104 is roughly half that of the input voltage. For example, if the input voltage is 1.9V, and the capacitance of capacitor 102 is the same as the gate capacitance of transistor 104, then the voltage across each of MOL capacitor 102 and thin-film transistor 104 will be 0.95 V, which is well below the breakdown voltages of the thin oxides of thin-film transistors such as transistor 104 and those of the core of the integrated circuit.

In some embodiments, MOL capacitor 102 is formed with low parasitics so that energy is efficiently transferred to the gate. Consequently, forming MOL capacitor 102 from the gate capacitance of a transistor is less efficient because transistors have parasitic capacitances to the well and/or the substrate, and also have significant gate leakage, that can affect the efficiency of the level shifter formed by the arrangement. Furthermore, MOL capacitor 102 should be formed as area efficient as possible on the integrated circuit and with as few additional process steps as is possible. Consequently, standard metal-on-metal (MOM) capacitors are not appropriate because of the low capacitor density and the increased number of process steps to produce such capacitors in the vicinity of the thin-film transistor technologies.

In order to avoid producing capacitors with thick oxides, with the inherent difficulties as discussed above, embodiments of the present invention form a thin-film capacitance during the formation of contacts to transistors in a middle-of-the-line (MOL) process. Semiconductor processing can be traditionally described in terms of front-end-of-the-line (FEOL), middle-of-the-line (MOL), and back-end-of-the-line (BEOL) processes. Typically, FEOL processes refer to wafer preparation, isolation, well formation, gate patterning, spacer, extension and source/drain implantation, silicide formation and other types of processes. As described, transistor formation, especially the fin structures of finFET technologies, is typically accomplished during FEOL processing. MOL processing typically includes gate contact formation. Modern processing typically involve FinFET technology, with separation between the sources and drains that form the FET. BEOL processing typically involves the metallization steps.

Figure 2A:
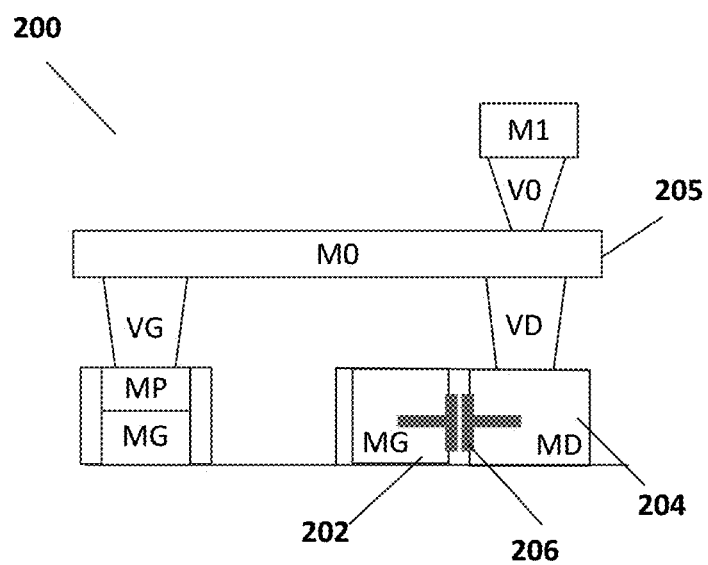
FIGS. 2A and 2B illustrate formation of a middle-of-the-line (MOL) capacitor according to some embodiments.

Formation of a MOL capacitor according to some embodiments includes providing the contact structure adjacent to the gate structure formed with the finFET technology. FIG. 2A illustrates a structure 200 formed during MOL processing. Structure 200 includes a contact 204 proximate to a gate 202. Capacitor 206 is formed between contact 204 and gate 202. Capacitor 206 can be used as the MOL capacitor 102 illustrated in the structure of FIG. 1, for example. The MOL layers illustrated in FIG. 2A are similar to the finFET technologies currently used. As is further illustrated in FIG. 2A, the capacitance of MOL capacitor 206 can be determined by the spacing between contact 204 and gate 202 as well as the dielectric used between contact 204 and gate 202. Metallization 205 can be provided to contact capacitor 206 and form connections to thin-film transistors such as thin-film transistor 104, for example.

Figure 2B:
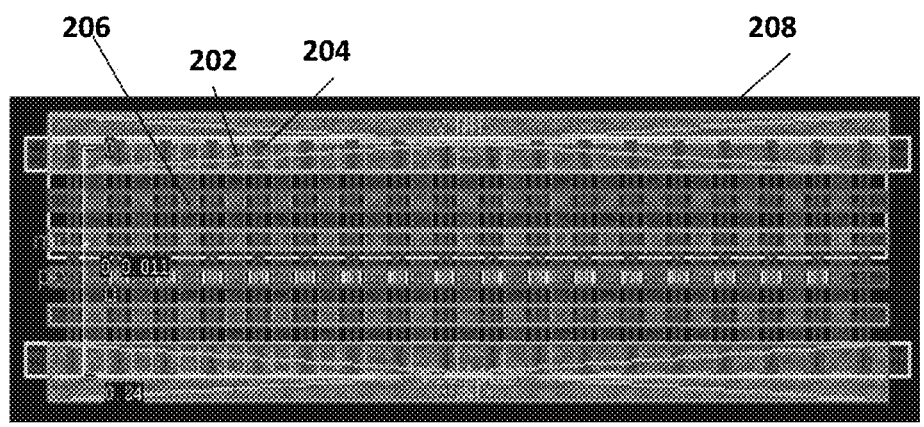

FIG. 2B illustrates a layout structure 208 as illustrated in FIG. 2A. As shown in FIG. 2B, capacitors 206 can be formed between parallel gates 202 and contacts 204. The height and width of gate 202 and contact 204 can be any formable fin type structure. In one particular example, provided for clarification only, a gate height of 240 nanometers (nm) and a gate width of 1 micrometer (μm) can produce a capacitance of capacitor 206 of about 2 femto-Farads (fF), which is very comparable to the gate capacitance of a thin-oxide transistor as is illustrated in FIG. 1. Other values of capacitance can be formed by adjusting the heights and widths of gate 202 and contacts 204.

An advantage of the structure illustrated in FIGS. 2A and 2B is that they can be implemented using standard cell libraries for production of integrated circuits with advanced technologies. Further, no metal layers above the M0 metallization layer, as illustrated in FIG. 2A, is used in preparing the MOL capacitor 206. As illustrated in FIG. 2B, capacitor 206 is formed with fingers of gate 202 and continuous contacts 204 on top of field oxide shallow-trench isolation (STI). The STI processing can reduce parasitic capacitances that reduce the efficiency of the formed MOL capacitor 206. This structure further distinguishes MOL capacitor 206 from the gate capacitance of thin-film transistors such as transistor 104, which will include gate leakage and parasitic capacitances.

Figure 2C:
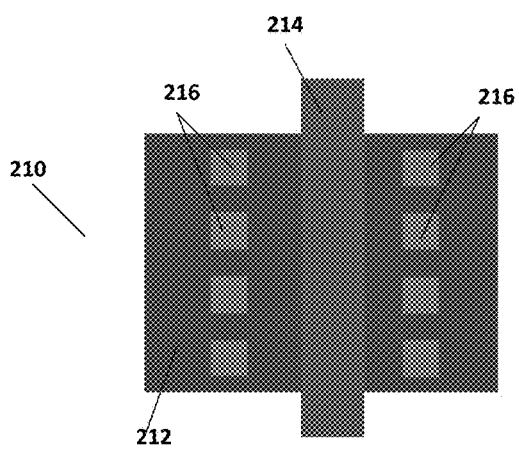
FIGS. 2C and 2D compare earlier technologies for MOL processing with advanced MOL processing that can be used to form MOL capacitors according to some embodiments.
Figure 2D:
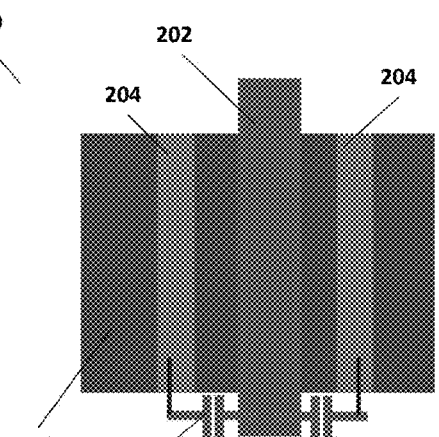

FIGS. 2C and 2D illustrate the difference between an advanced technology (FIG. 2D) that can be used according to the present invention and an old technology (FIG. 2C), such as a 28 nm technology, that may not provide sufficient capacitance for formation of a sufficient capacitance. The advanced technology illustrated in FIG. 2D can include the 7 nm technology or future technologies with smaller feature sizes. As illustrated in FIG. 2C, the older MOL technology illustrated in gate structure 210 includes a gate 214 deposited on a diffusion layer 212. Contacts 216 in FIG. 2C are simple square contacts arranged in a row parallel to gate 214.

In the advanced technology structure 220, however, contacts 204 are formed as a continuous strip parallel with gate 204, resulting in a much higher capacitance 206 formed between contact 204 and gate 202. As a result of the much higher capacitance provided by structure 220, capacitors 206 are formed between contacts 204 and gate 202. Further, in formation of MOL capacitor 206 with the technology illustrated in FIG. 2D, gate 202 and contact 204 are formed on a substrate 220 that can be a STI layer as discussed above in order to reduce the parasitic capacitance.

FIG. 2D may also illustrate formation of MOL capacitors according to the 7 nm technology. With 7 nm technology, mixing the thin-film technology with thick-film technology comes with much higher penalties. Also, the 7 nm technology may have much more specific design rules regarding latch up. In particular, use of MOL capacitors according to some embodiments mitigate several of the 7 nm design rules.

Figure 2E:
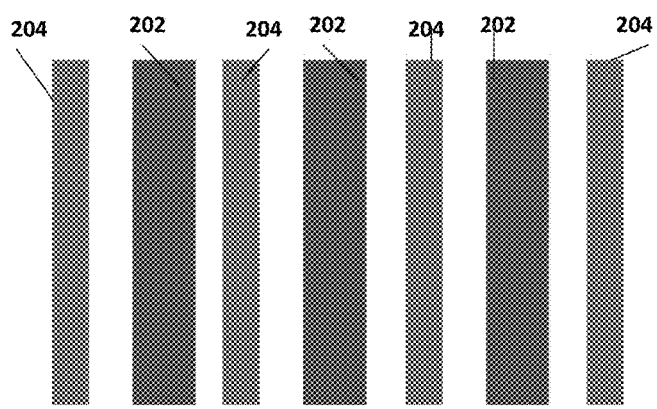
FIG. 2E illustrates spacings for contacts and gates used to form MOL capacitors according to some embodiments.

FIG. 2E illustrates spacing between gates 202 and contacts 204. The spacing between contact 204 and gate 202 is much smaller than the spacing between metallizations that may be used on a metal-oxide-metal (MOM) thick-oxide capacitor, resulting in a much high capacitor density than is available in conventional thick-oxide formation. For example, the spacing between gate 202 and contact 204 can be about 11 nm while the metallization spacing in M1 metallization is 22 nm.

Figure 2F:
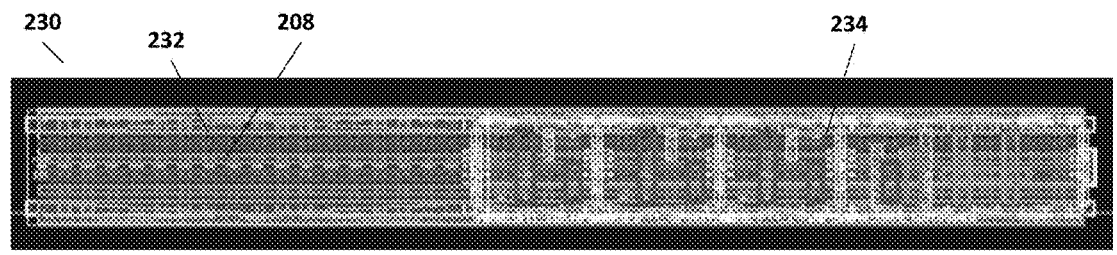
FIG. 2F illustrates an integrated circuit that includes level shifter circuits according to some embodiments.

FIG. 2F illustrates an area layout on an integrated circuit 230 where MOL capacitors 206 and thin-film transistors that can be used to form circuits such as that illustrated in FIG. 1 can be formed. As is illustrated in FIG. 2F, capacitors can be formed in capacitor area 232 while thin-film transistors used to form the remainder of a level shifter can be formed in transistor area 234. Integrated circuit 230 can be any integrated circuit and include circuitry formed with core thin-film transistors.

As is discussed above, the MOL capacitors 206 are formed between parallel strip contacts 204 and gate 202 formed as part of a finFET technology while the transistors in area 234 can be formed as thin-oxide finFET transistors. For example, capacitors can be formed with gates that have a height of 240 nm and a width of about 5 µm. Transistors can be formed with a height of about 2.5 µm and a width of about 18 µm. Metallization during the BEOL process can be used to link the MOL capacitors and transistors into level shifter circuits. One skilled in the art will recognize how to couple MOL capacitors 206 in capacitor area 232 with the thin-oxide finFET transistors in transistor area 234 to provide for level-shifter circuits such as circuit 100 illustrated in FIG. 1.

The structure illustrated in FIG. 1 can, however, have a problem in that the node between capacitor 102 and transistor 104 is a floating node which can be at any voltage. The floating node can be charged through processing, for example etch processes, or can be charged through gate leakage. Consequently, the floating node may cause erratic circuit results. Consequently, in some embodiments a latching circuit can be formed between capacitor 102 and transistor 104.

Figure 3A:
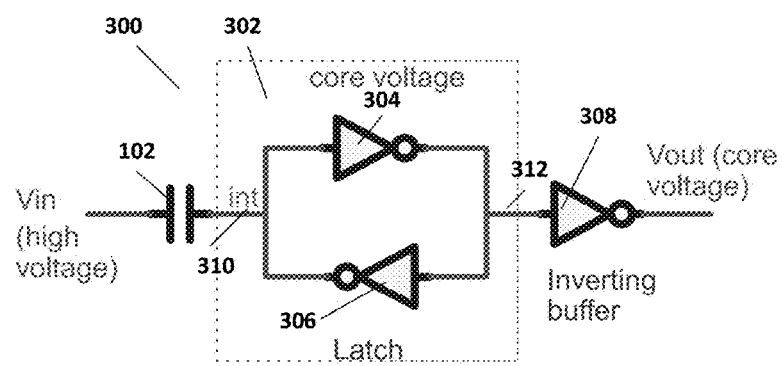
FIGS. 3A and 3B illustrate level shifter circuits according to some embodiments.

FIG. 3A illustrates an embodiment of the invention with a latch circuit 302 that latches the node between capacitor 102 and transistor 104. As illustrated in FIG. 3A, MOL capacitor 102 is coupled to latch circuit 302. Inverter 308 (which replaces transistor 104) is coupled to latch circuit 302. Latch circuit 302 can be formed by parallel cross-coupled inverters 304 and 306. Latch circuit 302 effectively creates nodes 310 and 312, each of which is held at either the core voltage Vdd or ground Vss by latch 302. MOL capacitor 102 can be sufficiently sized to flip latch 302. The input voltage Vin illustrated in circuit 300 refers to a high voltage such as the input pad voltage of the integrated circuit. The output voltage Vout is the core voltage, Vdd, which is appropriate for application with thin-film transistors.

As is illustrated in FIG. 3A, the voltage at node 310, Vint, and the voltage at node 312 are either Vdd (the internal core voltage) or Vss (internal ground). If the voltage at node 310 is Vdd, then the voltage at node 312 is Vss and the output voltage from inverter 308, Vout, will be Vdd. However, latch circuit 302 may also settle into a state where the voltage at node 310 is Vss, which results in an output voltage Vout of Vss as well and a voltage across MOL capacitor 102 that is the input voltage Vin. Such a state may not be desirable. Consequently, an initiation circuit can be added to set the state of latch circuit 302 as desired.

Figure 3B:
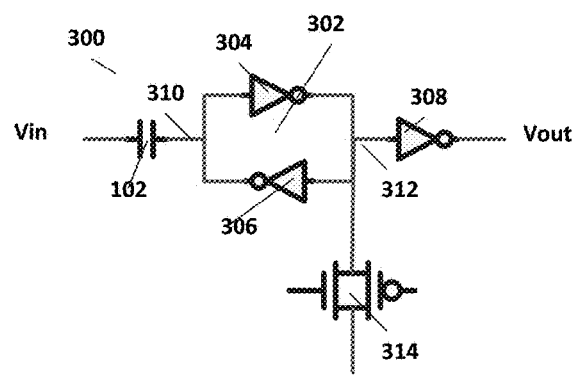

FIG. 3B illustrates an embodiment that includes an initiation circuit 314. As is discussed above, with latch 302 nodes 310 and 312 can start in either of two states: node 310 at Vdd and node 312 at Vss; or node 310 at Vss and node 312 at Vdd. Initiation circuit 314 can be used to set the initial state of nodes 310 and 312. In some embodiments, nodes 310 and 312 can be initiated according to the input voltage Vin. In some embodiments, nodes 310 and 312 can be initiated so that the output voltage Vout is the voltage at node 310, Vint. As shown in FIG. 3B, initiation circuit 314 can be formed by coupling two thin-film transistors. Specifically, initiation circuit 314 has a pFET and an nFET. The source of the pFET is coupled to the drain of the nFET, while the drain of the pFET is coupled to the source of the nFET. The gates of the pFET and nFET can be tied to high or low voltages depending on the desired initiation state. Although initiation circuit 314 is shown as coupled to node 312 in FIG. 3B, one skilled in the art will recognize that initiation circuit 314 may also be coupled to node 310.

Figure 4:
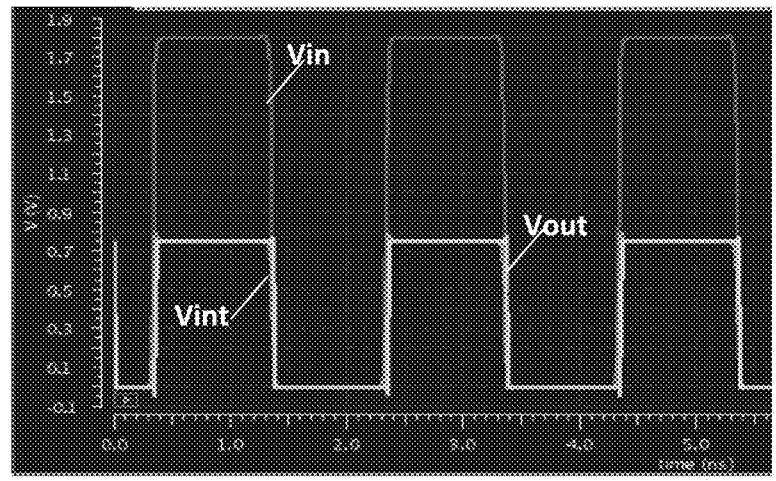
FIG. 4 illustrates a simulation of operation of a level shifter circuit as illustrated in FIG. 3B.

FIG. 4 illustrates simulated operation of circuit 300. In the simulation, the capacitance of MOL cap 102 is sized roughly 10 times that of the input gate capacitance of transistors such as transistors 104 that are used to form circuit 300. As is illustrated in FIG. 4, the input voltage Vin is 1.8 V. The output voltage Vout as well as the voltage at node 310, Vint, is at 0.75 V. Consequently, the voltage level is shifted from an input voltage of 1.8 V to an output voltage of 0.75 V. One skilled in the art will recognize that the voltage provided are exemplary only and are not limiting in any fashion.

Figure 5A:
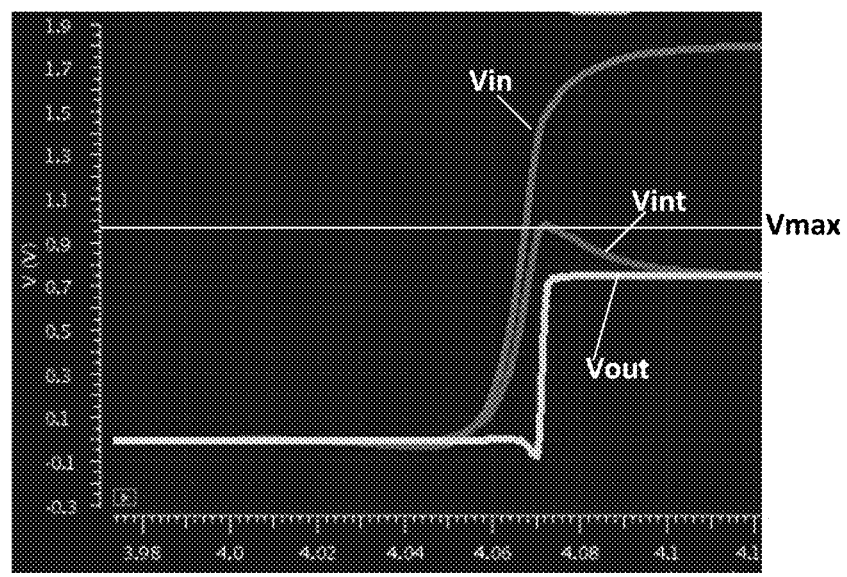
FIGS. 5A, 5B, and 5C illustrate voltage overshoot in embodiments of level shifter as illustrated in FIG. 3B.

An additional consideration for setting the size of MOL cap 102 relative to the capacitance of transistors 104 used in circuit 300 is voltage overshoot. If the capacitance of MOL cap 102 and the input voltage slew rate are too high, the internal node 310 (Vint) can overshoot the maximum allowed voltage (Vmax) for transistors 104 and thereby damage the thin-oxide transistors used in circuit 300. FIG. 5A illustrates voltage transitions with input Vin. As is illustrated, Vint may exceed the maximum voltage Vmax. Consequently, the size of MOL cap 102 can be chosen such that Vint does not exceed Vmax, even with the fastest slew rate (e.g. 50 ps) and the highest capacitance of the thin-film transistor gates.

Figure 5B:
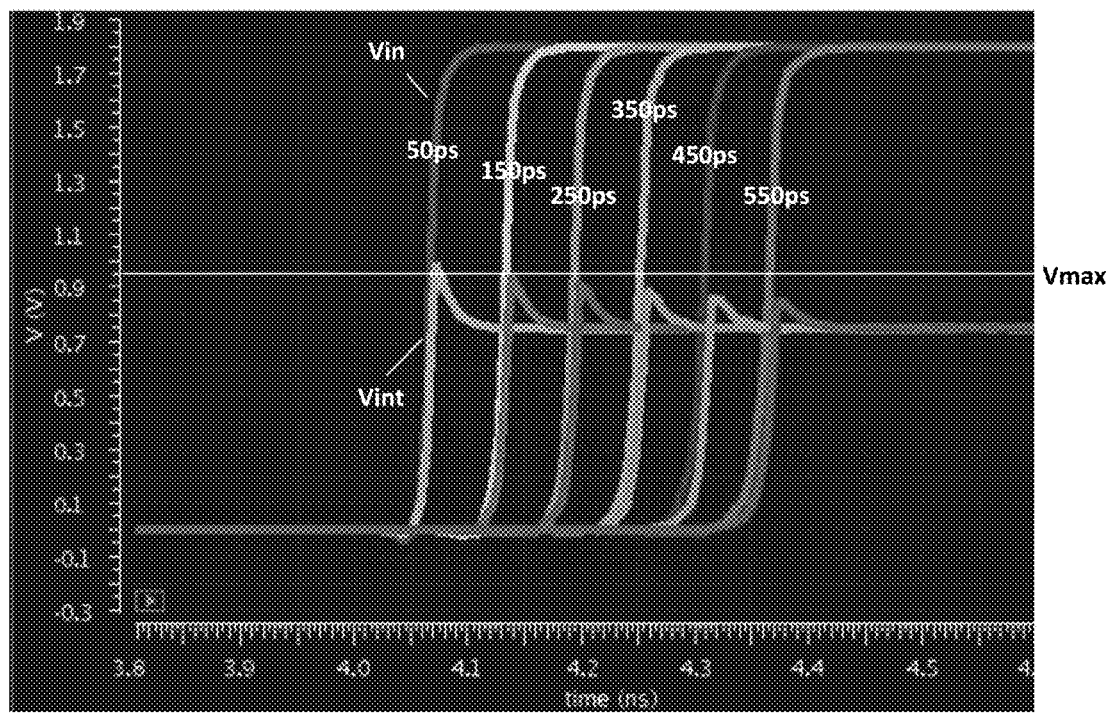
Figure 5C:
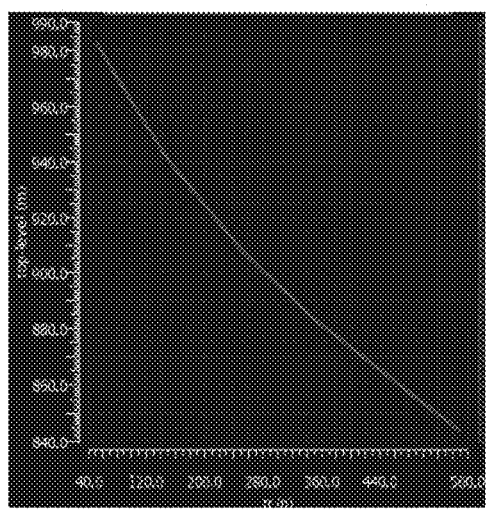

FIG. 5B illustrates a comparison of voltage overshoot with various slew rates. The MOL cap 102 is again set at about 10 times the transistor gate capacitance as is consistent with the simulation of circuit 300 as shown in FIG. 4. The input slew rates that are—50 ps, 150 ps, 250 ps, 350 ps, 450 ps, and 550 ps—can be commonly provided in the currently available standard libraries. Furthermore, a maximum voltage Vmax of about 0.95V is illustrated for comparison. Again, the combination of slew rate and capacitance of the MOL capacitor can be chosen so that the voltage at node 310, Vint, does not exceed the maximum voltage, Vmax, as the input voltage, Vin, slews to its input voltage and Vint tracks to follow. FIG. 5C illustrates the maximum voltage at node 310, Vint, as a function of input voltage slew rate for the example circuit 300 illustrated in FIG. 3B and simulated in FIG. 4. As is readily apparent, the maximum voltage at node 310 falls as a function of the input slew rate.

Figure 6:
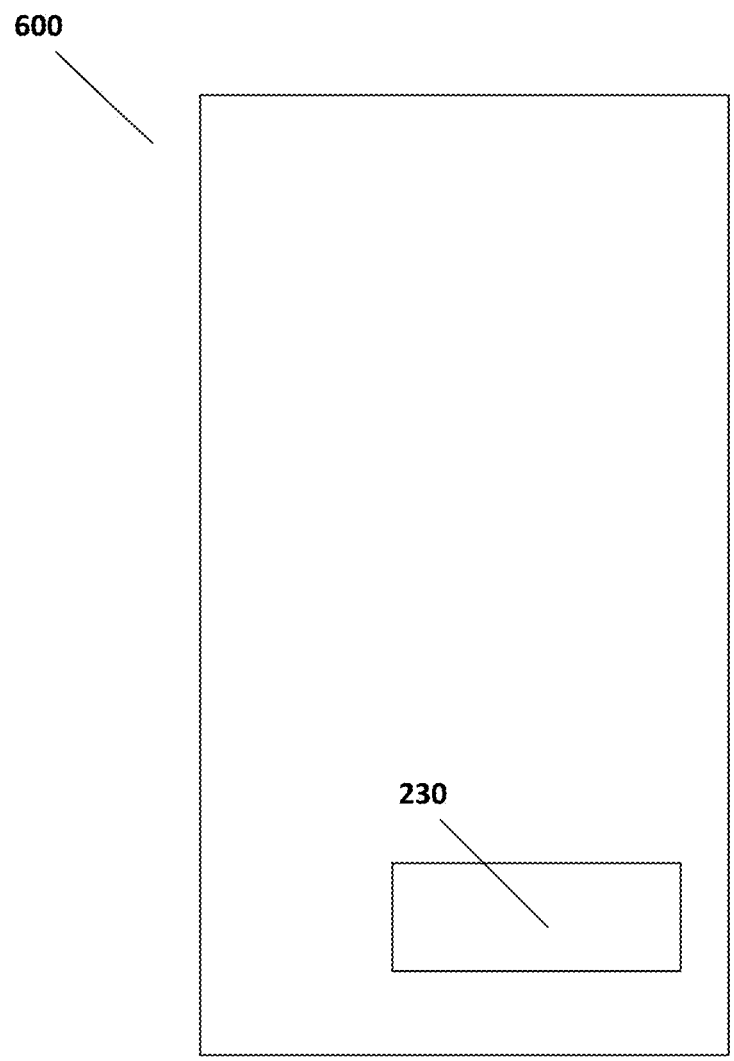
FIG. 6 illustrates a device that includes an integrated circuit as illustrated in FIG. 2F.

FIG. 6 illustrates a device 600 with an integrated circuit 230 that includes MOL capacitor area 232 and thin-film transistor area 234 used in the formation of level shifter circuits. As discussed above the level shifter circuits can shift a high voltage input from pads 602 to voltage levels that do not damage thin-film transistors. Device 600 can be any device that includes integrated circuits and may include multiple integrated circuits according to embodiments of the present invention. As such, device 600 may be mobile devices or stationary devices. Examples of device 600 include, but are not limited to, phones, smart phones, tablets, laptop computers, electronic readers, computer systems, network devices (routers, switches, etc.), telecommunication devices (transmitters, receivers, telecommunications switches, etc.), data center devices (memory storage, controllers, etc.) or any other device that includes integrated circuits. Examples of integrated circuit 230 include, but are not limited to, volatile or non-volatile memory chips, microprocessors, microcontrollers, logic chips, interface chips, drivers, or any other integrated circuit.

Although illustrative embodiments have been shown and described, a wide range of modification, change and substitution is contemplated in the foregoing disclosure and in some instances, some features of the embodiments may be employed without a corresponding use of other features. One of ordinary skill in the art would recognize many variations, alternatives, and modifications.

What is claimed is:

1. A level shifter, comprising:
   a middle-of-the-line (MOL) capacitor, the MOL capacitor being formed by a contact proximate to a gate of a thin-film transistor; and
   a circuit including the thin-film transistor with the gate that forms part of the MOL capacitor,
   wherein an input voltage provided to the contact that forms part of the MOL capacitor is split between the MOL capacitor and the circuit.

2. The level shifter of claim 1, wherein the gate and the contact are formed with an advanced process.

3. The level shifter of claim 2, wherein the gate and the contact are formed with a 7 nm process technology.

4. The level shifter of claim 1, wherein the gate is a fin and the contact is a strip formed adjacent and parallel to the fin.

5. The level shifter of claim 4, wherein the gate and the contact are characterized by a height and a width.

6. The level shifter of claim 5, wherein a capacitance of the MOL capacitor is determined by the height and the width.

7. The level shifter of claim 6, wherein the capacitance of the MOL capacitor is set according to an input voltage slew such that an internal voltage remains below a maximum voltage.

8. The level shifter of claim 1, wherein the circuit includes a latch circuit coupled to an inverter.

9. The level shifter of claim 8, wherein an initiation circuit is coupled to set a state of the latch circuit.

10. The level shifter of claim 8, wherein the state of the latch circuit is adjusted such that an output voltage of the inverter is a core voltage Vdd.

11. A method of forming a level shifter using thin-oxide technologies, comprising:
    forming a middle-of-the-line (MOL) capacitor with a contact proximate to a gate of a thin-film transistor; and
    forming a circuit with the thin-film transistor associated with the gate that is part of the MOL capacitor,
    wherein an input voltage provided at the contact forming part of the MOL capacitor is split between the MOL capacitor and the circuit.

12. The method of claim 11, wherein forming the MOL capacitor includes
    providing a substrate with the gate of the thin-film transistor; and
    forming a contact strip adjacent to the gate, wherein the MOL capacitor is formed by the gate and the contact strip.

13. The method of claim 11, wherein forming the circuit includes forming a latch circuit between the MOL capacitor and an inverter.

14. The method of claim 13, wherein forming the circuit further includes forming an initiation circuit to set a state of the latch circuit.

15. An integrated circuit, comprising
    a level shifter coupled to an input pad to receive an input voltage, the level shifter comprising:
    a middle-of-the-line (MOL) capacitor, the MOL capacitor being formed by a contact proximate to a gate of a thin-film transistor; and
    a circuit including the thin-film transistor with the gate that forms part of the MOL capacitor,
    wherein the input voltage is split between the MOL capacitor and the circuit.

16. The integrated circuit of claim 15, wherein the MOL capacitor includes
    a fin gate; and
    the contact formed adjacent the gate.

17. The integrated circuit of claim 15, wherein the circuit includes a latch coupled to an inverter.

18. The integrated circuit of claim 17, wherein the circuit further includes an initiation circuit to set a state of the latch.

19. A device comprising:
    at least one integrated circuit that includes a level shifter coupled to an input pad to receive an input voltage, the level shifter including
    a middle-of-the-line (MOL) capacitor, the MOL capacitor being formed by a contact proximate to a gate of a thin-film transistor; and
    a circuit including the thin-film transistor with the gate that forms part of the MOL capacitor,
    wherein the input voltage is split between the MOL capacitor and the circuit.

20. The device of claim 19, wherein the circuit includes a latch circuit coupled to an inverter.

21. The device of claim 20, wherein the circuit further includes an initiation circuit to set a state of the latch circuit.

22. A level shifter, comprising:
    means for providing a MOL capacitor, the MOL capacitor being formed by a contact proximate to a gate of a thin-film transistor;
    means for providing a circuit including the thin-film transistor with the gate that forms part of the MOL capacitor,
    wherein an input voltage provided to the contact is split between the MOL capacitor and the circuit.

23. The level shifter of claim 22, wherein the means for providing a circuit includes means for latching coupled to a means for inverting.

24. The level shifter of claim 23, further including a means for initiating a state of the means for latching.

* * * * *